(12) United States Patent
Yong et al.

(10) Patent No.: US 7,821,141 B2
(45) Date of Patent: Oct. 26, 2010

(54) SEMICONDUCTOR DEVICE

(75) Inventors: Wae Chet Yong, Malacca (MY); Teck Sim Lee, Malacca (MY); Erich Griebl, Dorfen (DE); Mario Feldvoss, Munich (DE); Juergen Schredl, Mering (DE)

(73) Assignee: Infineon Technologies AG, Neubiberg (DE)

( * ) Notice: Subject to any disclaimer, the term of this patent is extended or adjusted under 35 U.S.C. 154(b) by 166 days.

(21) Appl. No.: 12/035,972

(22) Filed: Feb. 22, 2008

(65) Prior Publication Data
US 2009/0212417 A1   Aug. 27, 2009

(51) Int. Cl.
*H01L 23/28* (2006.01)
(52) U.S. Cl. ............ 257/796; 257/706; 257/E23.101
(58) Field of Classification Search .......... 257/276, 257/675, 676, 706, 796, E23.101; 438/124, 438/126, 127
See application file for complete search history.

(56) References Cited
U.S. PATENT DOCUMENTS
6,903,457 B2 *  6/2005  Nakajima et al. ........... 257/717
2005/0001311 A1  1/2005  Ho et al.

OTHER PUBLICATIONS

Datasheet: TO-247AD Package Outline Drawing Spec_ver2, http://www.irf.com/package/outline/po_to247ad.pdf, 1 pg., International Rectifier, El Segundo, CA.
Datasheet: STGW30N90D N-channel 900V—30A—TO-247 Very fast PowerMESH™ IGBT, http://www.st.com/stonline/products/literature/ds/13766/stgw30n90d.pdf, 10 pgs., STMicroelectronics.
Datasheet: 2SB775/2SD895, series-NPN triple diffused planar silicon transistor, www.sanyo.com., 4 pgs., Sanyo Electric Corp., Ltd., Allendale, NJ.
Arnold, M., "The Revolution in Discrete Isolation Technique," Technical Application, www.ixys.com, 5 pgs., IXYS Corporation, Santa Clara, CA.
STMicroelectronics, Surface mounting packages; Through hole packages, Order code: SGPMOSFET1006, www.st.com, Oct. 2006.

* cited by examiner

*Primary Examiner*—Quoc D Hoang
(74) *Attorney, Agent, or Firm*—Slater & Matsil, L.L.P.

(57) ABSTRACT

A semiconductor device including: a heat sink, a die on the heat sink, resin encapsulating the die, and a mounting aperture in the resin having at least a segment between the heat sink and a first end of the resin, wherein the thickness of the heat sink is no greater than 35% of the thickness of the device.

29 Claims, 7 Drawing Sheets

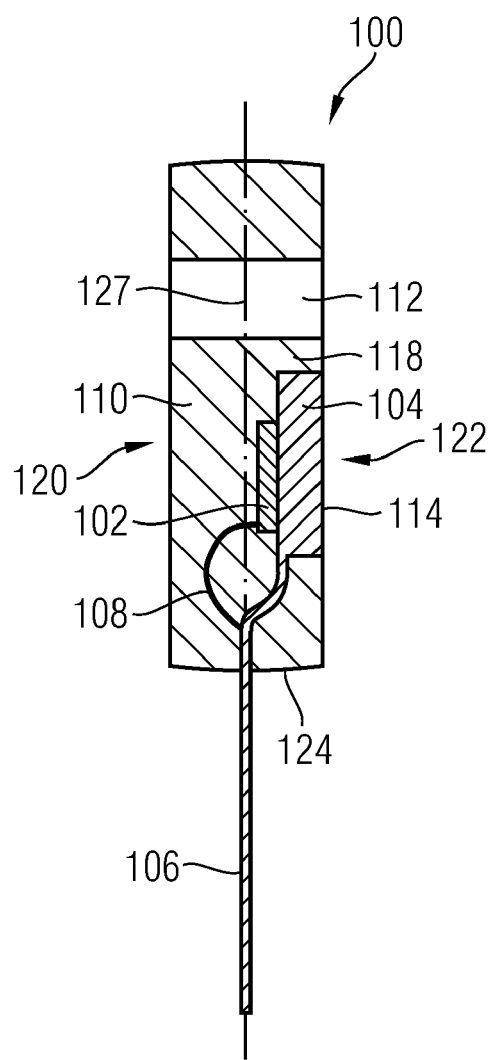
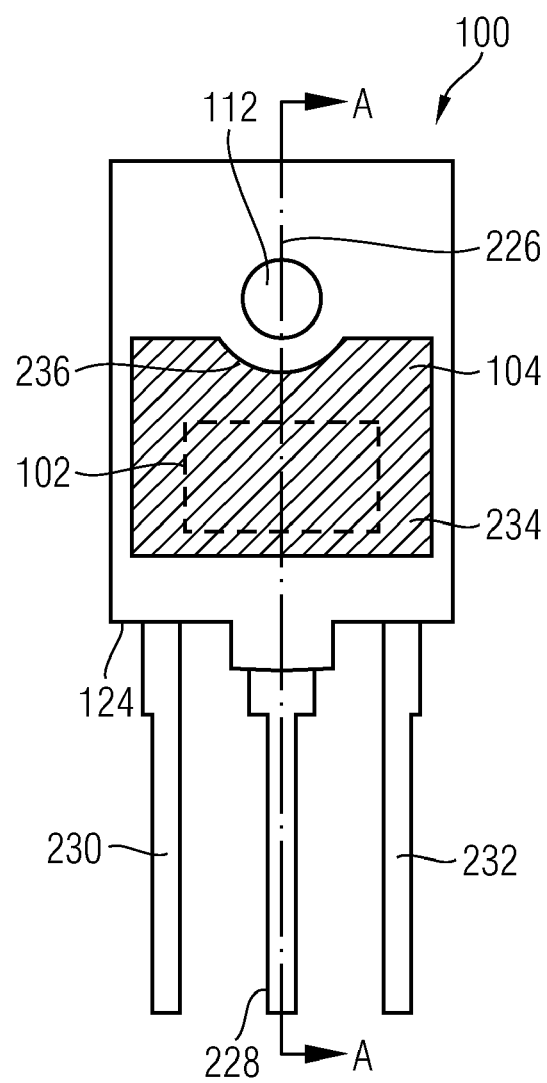

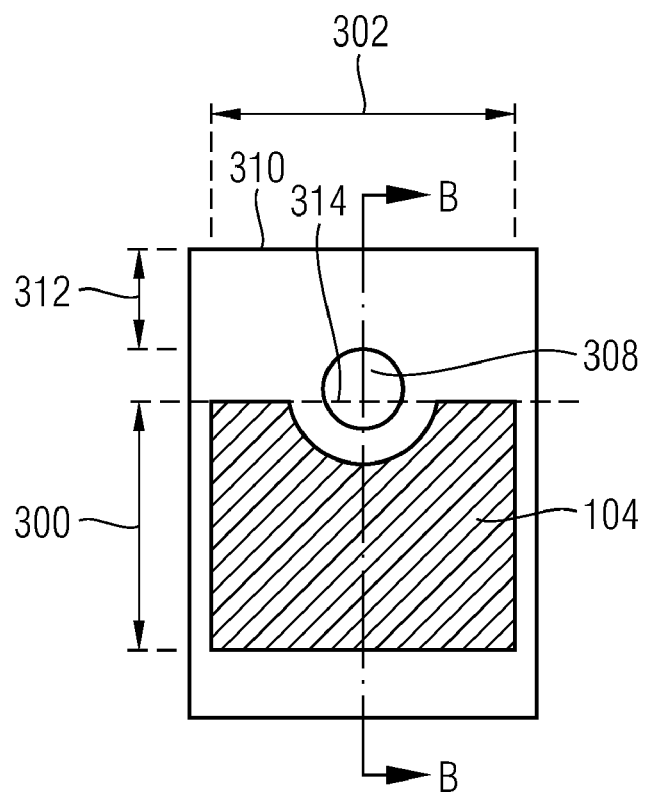
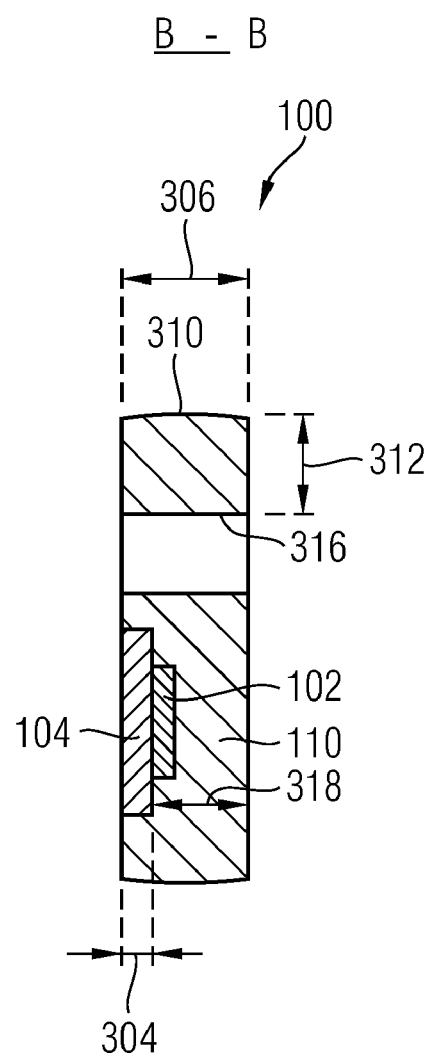
FIG 3A
FIG 3B
B - B

SEMICONDUCTOR DEVICE

BACKGROUND

Embodiments of this invention relate to a semiconductor device, a method of packaging a semiconductor device, a method of mounting a semiconductor device, and refers particularly, though not exclusively, to packaging of a semiconductor device possessing thermal dissipation structure.

Various types of semiconductor packages exist where the semiconductor is encapsulated in resin. In some types of encapsulated devices the semiconductor die is located on a heat sink, heat slug or thermal pad. The heat sink is part of the metal leadframe. The heat sink may be exposed on one face to allow better thermal dissipation. In other cases the heat sink may be covered by a portion of the resin encapsulate.

For high power applications, for example, a Transistor Outline ("TO") package, it may be necessary to attach the TO package to an external heat sink to dissipate the heat generated by the transistor. Some TO packages include a screw hole for mounting the TO package to an external heat sink.

BRIEF DESCRIPTION OF THE DRAWINGS

There shall now be described by way of non-limitative, example only some exemplary embodiments, the description being with reference to the accompanying illustrative drawings in which:

FIG. 1 is a cross-sectional view of a TO package according to an exemplary embodiment;

FIG. 2 is a back view of a TO package according to the exemplary embodiment in FIG. 1;

FIGS. 3(a) and 3(b), collectively as FIG. 3, are simplified cross section and back views of a TO package according to the exemplary embodiment in FIG. 1;

DETAILED DESCRIPTION OF ILLUSTRATIVE EMBODIMENTS

Figure 4:
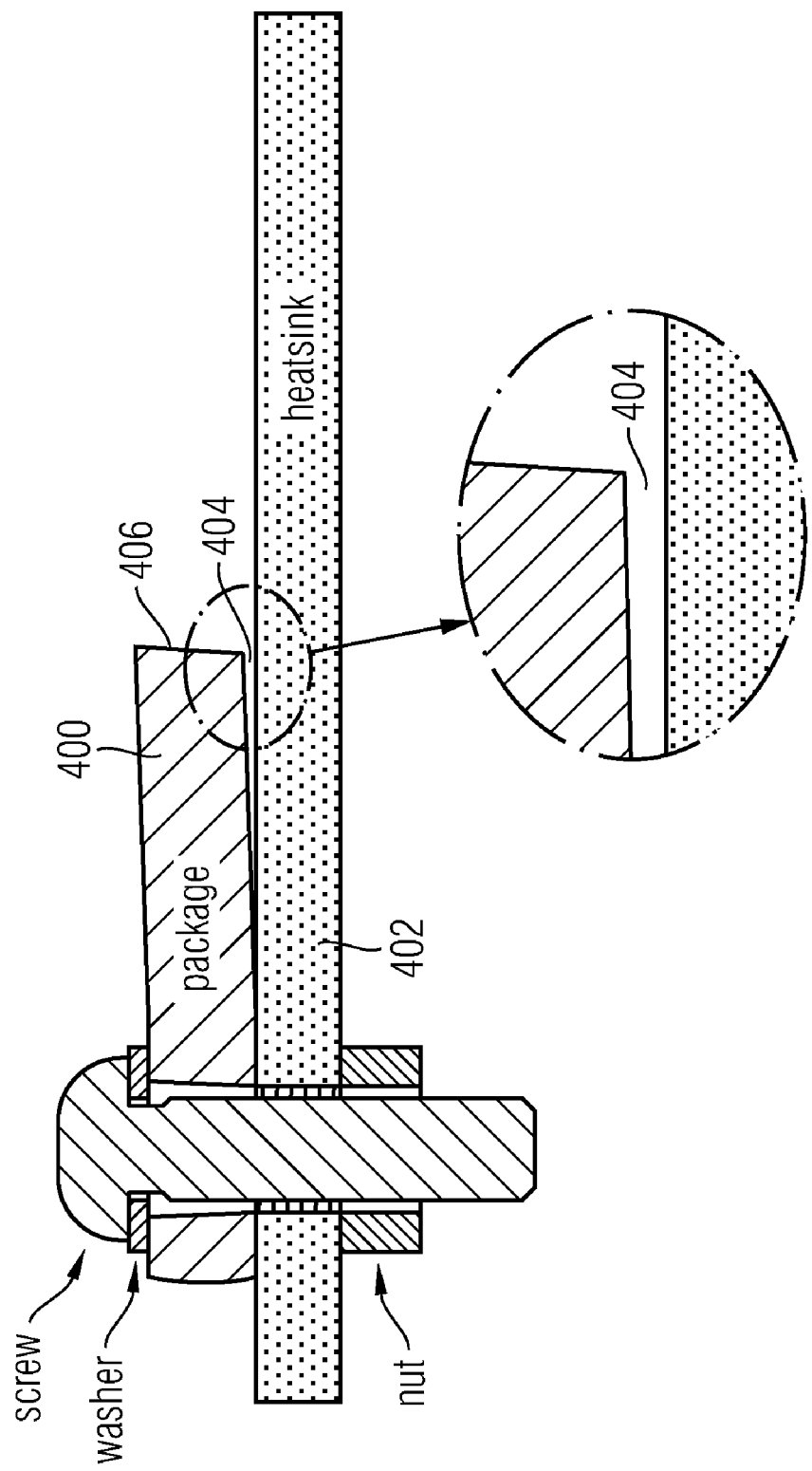
FIG. 4 is a side view of the warpage.

A TO247 package 100 according to an exemplary embodiment is shown in FIGS. 1 and 2. The package 100 includes a transistor semiconductor die 102 on a metal heat sink 104. A number of leads 106 provide external electrical connection and are electrically connected to the die 102 via wire bonds 108. The device is encapsulated by resin 110. The resin 110 defines a mounting aperture or screw hole 112 used to attach the package to an external heat sink (not shown) or other heat transfer device. The heat sink 104 is surrounded on all but one face by the resin 110, with an exposed face 114 to directly contact an external heat sink (not shown).

The heat sink 104 may be thinner and/or shorter. The cost of the package 100 may in part be determined by the amount of raw material required. For example, the leadframe may be made of copper and may be a significant portion of the overall cost.

The package 100 includes a front face 120 and a back face 122 and the resin 110 is generally cuboid in external shape, although other shapes may be appropriate depending on the application. The leads 106 extend from the bottom end 124 of the resin 110. The resin defines a longitudinal axis 226. The center of the die 102 is located approximately one third along the length of the resin 110 starting from the bottom end 124, and is centered about the longitudinal axis 226. The center of the screw hole 112 is located approximately three quarters along the length of the resin 110 starting from the bottom end 124, centered about the longitudinal axis 226. The exposed face 114 of the heat sink 104 forms part of the back face 122. The leads 106 extend from an imaginary center line 127 between the front face 120 and a back face 122 at the bottom end 124. The middle lead 228 is physically connected to the heat sink 104 and the side leads 230, 232 are physically spaced from and electrically connected to the die 102. The heat sink 104 includes a portion 234 surrounding the die 102, and another portion 236 partially surrounding the screw hole 112. The portion 236 partially surrounding the screw hole 112 is spaced therefrom by an isolation portion 118 of the resin 110. As shown in FIGS. 3(a) and 3(b) the length 300, width 302 and thickness 304 of the heat sink 104 may be selected according to the application.

The term "thin heat sink" means a heat sink having a thickness 304 which is less than 35% of the thickness of the package. For example, in a TO247 package 100 such as shown in FIGS. 1 and 2, if the package has an overall thickness 306 of about 5.15 mm a thin heat sink 104 is one that is equal to or no greater than about 1.8 mm thick or less than about 1 mm thick such as about 0.5 mm thick. As such, in the areas 318 where the resin 110 overlaps the heat sink 104, the resin 110 would be equal to greater than 3.35 mm in thickness. For example the heat sink 104 may be no greater than 20% or no greater than 10% of the package thickness.

An advantage of using a thin heat sink 104 may be a reduction in the volume of copper required and/or a reduction in overall cost of the device.

Using a thin heat sink 104 may affect package distortion or warpage during curing of the resin 110. Because the resin 110 and the heat sink 104 have different coefficients of expansion, distortion may occur when the resin 110 is heated during curing. After curing, the resin 110 is hard so it retains the distorted shape even after it has cooled. The degree of warpage may be related to the relative thickness of the heat sink 104 and the resin 110. For example, reducing the thickness of the heat sink 104 may increase warpage.

A certain amount of warpage can be accommodated by filing any gaps between the heat sink 104 and the external heat sink with thermal paste. However a larger gap may still degrade the thermal performance. By reducing the length of the heat sink 104, for example, the portion adjacent the screw hole 112, the degree of warpage may be reduced.

For example, as shown in FIG. 3 the term "short heat sink" means that at least a segment 308 of the screw hole 112 is between the heat sink 104 and the first or top end 310. The screw hole 112 and the top end 310 thereby define a zone 312, into which the heat sink 104 does not extend. An imaginary lateral line 314 crosses the point of the heat sink closest to the top end 310. In FIGS. 1 and 2 the entire screw hole 112 is between the heat sink 104 and the top end 310. The heat sink in FIG. 3 is slightly longer than that shown in FIGS. 1 and 2, and the imaginary lateral line 314 may bisect the screw hole 112 defining the segment 308, for example, being a major segment of the screw hole 112. In the TO247 package 100 shown in FIGS. 1 and 2, the upper edge 316 of the screw hole 112 is 3.7 mm from the top end 310, so a short heat sink 104 is spaced from the top end 310 by a distance greater than about 3.7 mm. Alternatively the term "short heat sink" means the heat sink 104 has a major surface with an area no greater than 150% of the area of a major surface of the die. The area of the major surface of the heat sink 104 excludes the leads 106 and includes up to the imaginary lateral line 314.

Using a short heat sink may have the advantage of reducing warpage, reducing the volume of copper required and/or reducing the overall cost of the device.

FIG. 4 shows a package 400 mounted on an external heat sink 402, where the gap 404 at the bottom end 406 (the end remote of the screw hole 112) represents the warpage. With a longer heat sink (heat sink about 0.5 mm thick and about 17 mm long) the warpage was experimentally determined to be about 53 µm. Using a short heat sink according to the exemplary embodiment (heat sink about 0.5 mm thick and about 12 mm long) the warpage is about 25 µm. For example in a TO247 package 100 such as shown in FIGS. 1 and 2, the warpage may be no greater than about 30 µm.

Figure 5:
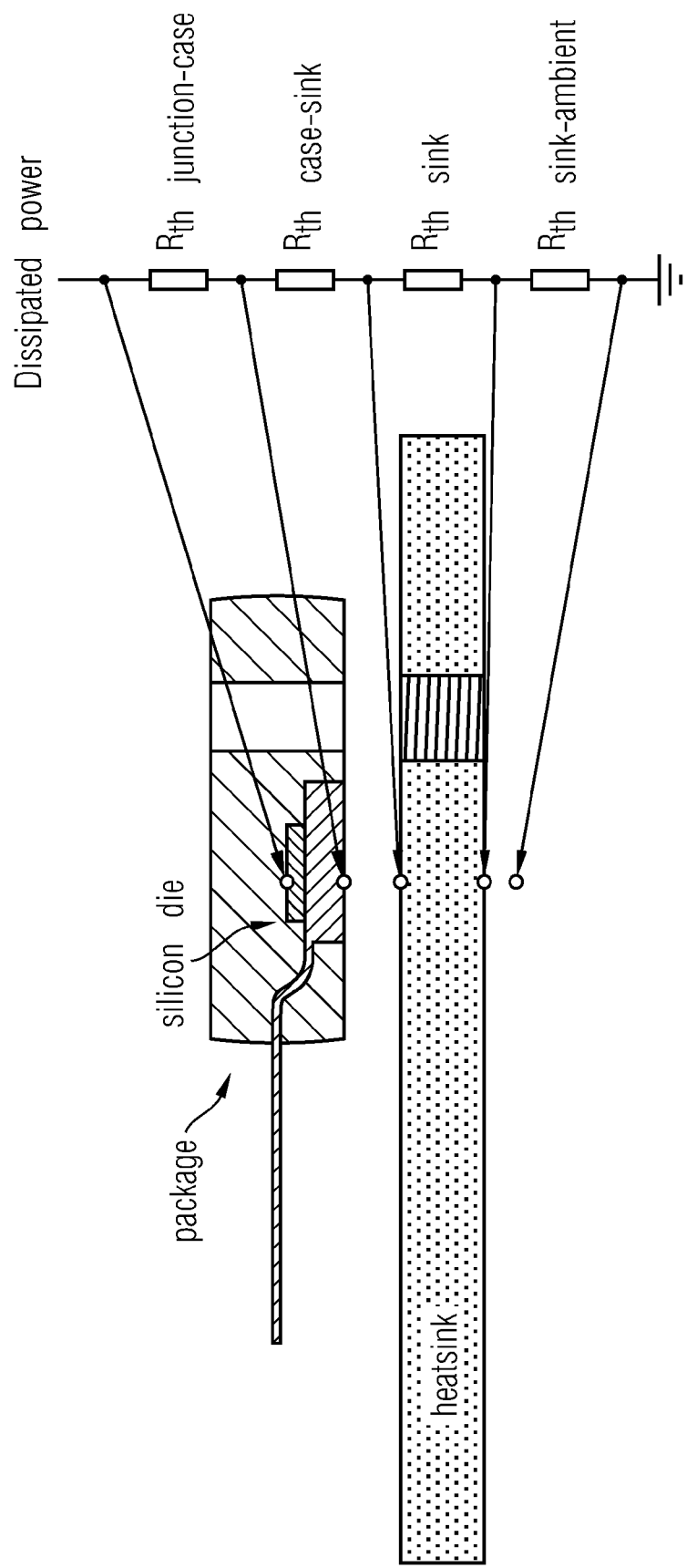
FIG. 5 is a schematic diagram showing the components of the thermal resistance.

Using a short heat sink 104 may affect the thermal dissipation, as the surface area over which the die transfers heat to the external heat sink 402 is reduced. However the thermal resistance ("$R_{th}$") is governed by a number of factors including the level of warpage, the type of mounting to the heat sink 402, the heat distribution over the heat sink 104, as well as the surface area of the heat sink 104. As seen in FIG. 5 the configuration of heat sink 104 is related to the $R_{th\,junction-case}$ and the warpage is related to the $R_{th\,case-sink}$.

When a thin heat sink 104 is used the heat transfer may be concentrated directly adjacent the die 102. Consequently, portions distant the die 102, for example, near the screw hole 112 and/or zone 312, have less impact on the $R_{th}$. As such, shortening a thin heat sink 104 may have less of an effect on $R_{th}$ than would normally be the case for shortening a thicker heat sink.

Furthermore, because using a short heat sink may reduce warpage, using a thin and short heat sink may maintain or not significantly degrade the $R_{th}$.

Figure 6A:
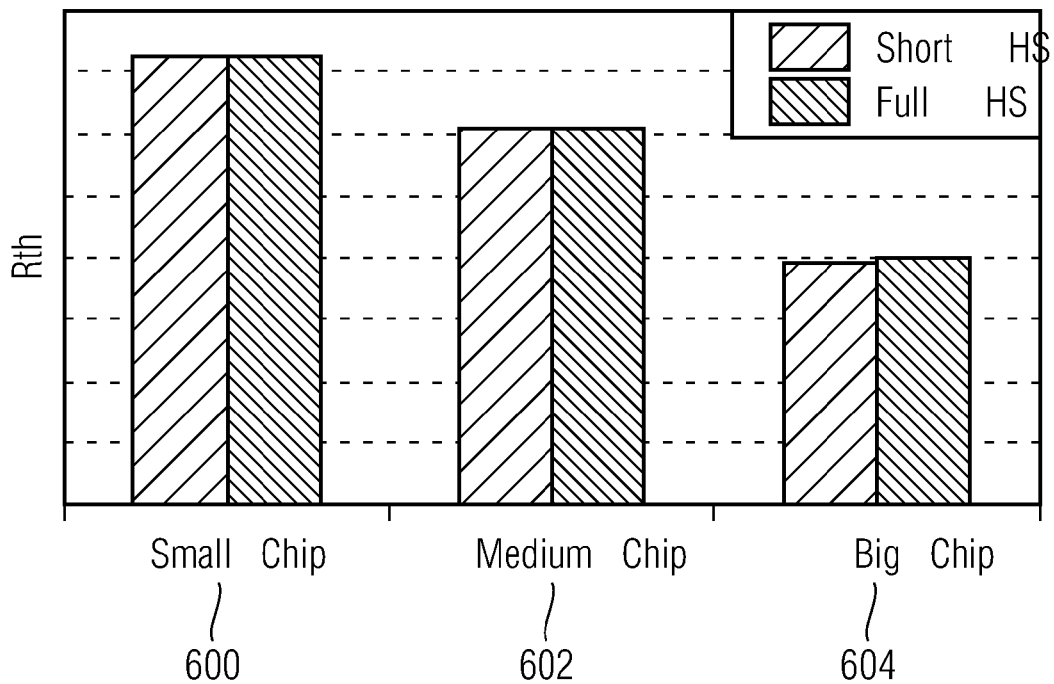
FIGS. 6(a) and 6(b) are graphs of thermal performance of a longer heat sink compared to a short heat sink.
Figure 6B:
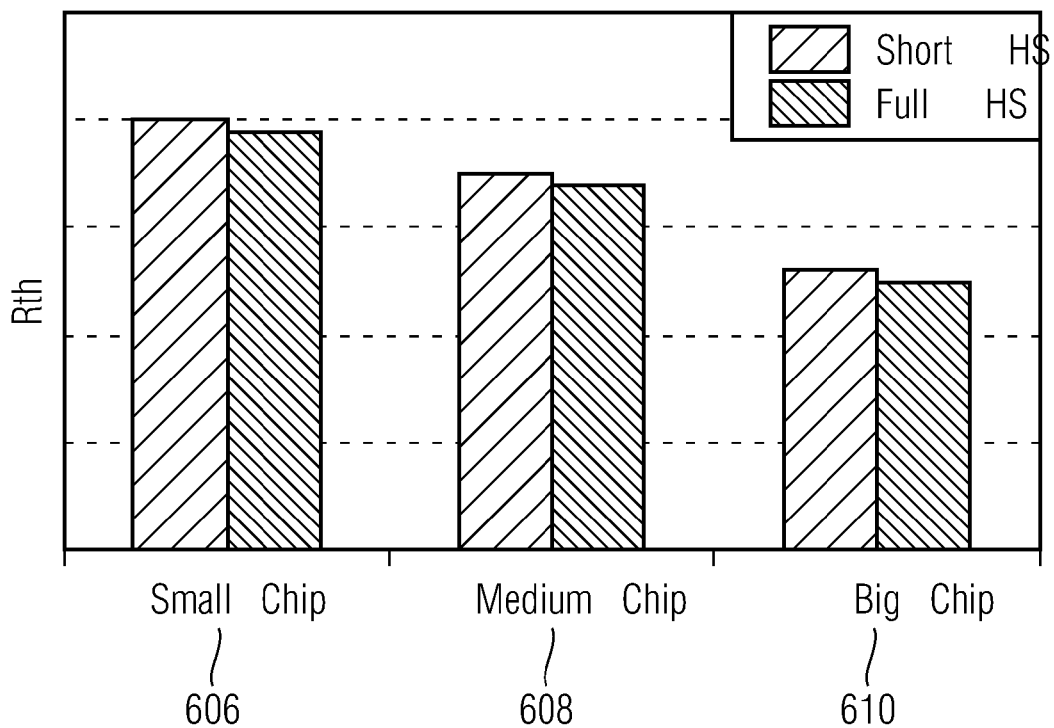

FIGS. 6(a) and 6(b) show there is little change in $R_{th}$ using the short heat sink according to the exemplary embodiment compared to a longer heat sink. In FIG. 6(a) with heat conducting paste; for a small chip 600 and a medium chip 602 there is no change and for a large chip 604 there is about a 2% decrease. In FIG. 6(b) using silica foil; with a small chip 606 there is about a 2.6% increase, with a medium chip 608 there is about a 2.9% increase and with a large chip 610 there is about a 4.8% increase. In all cases the thickness of the heat sink was about 0.5 mm.

Figure 7:
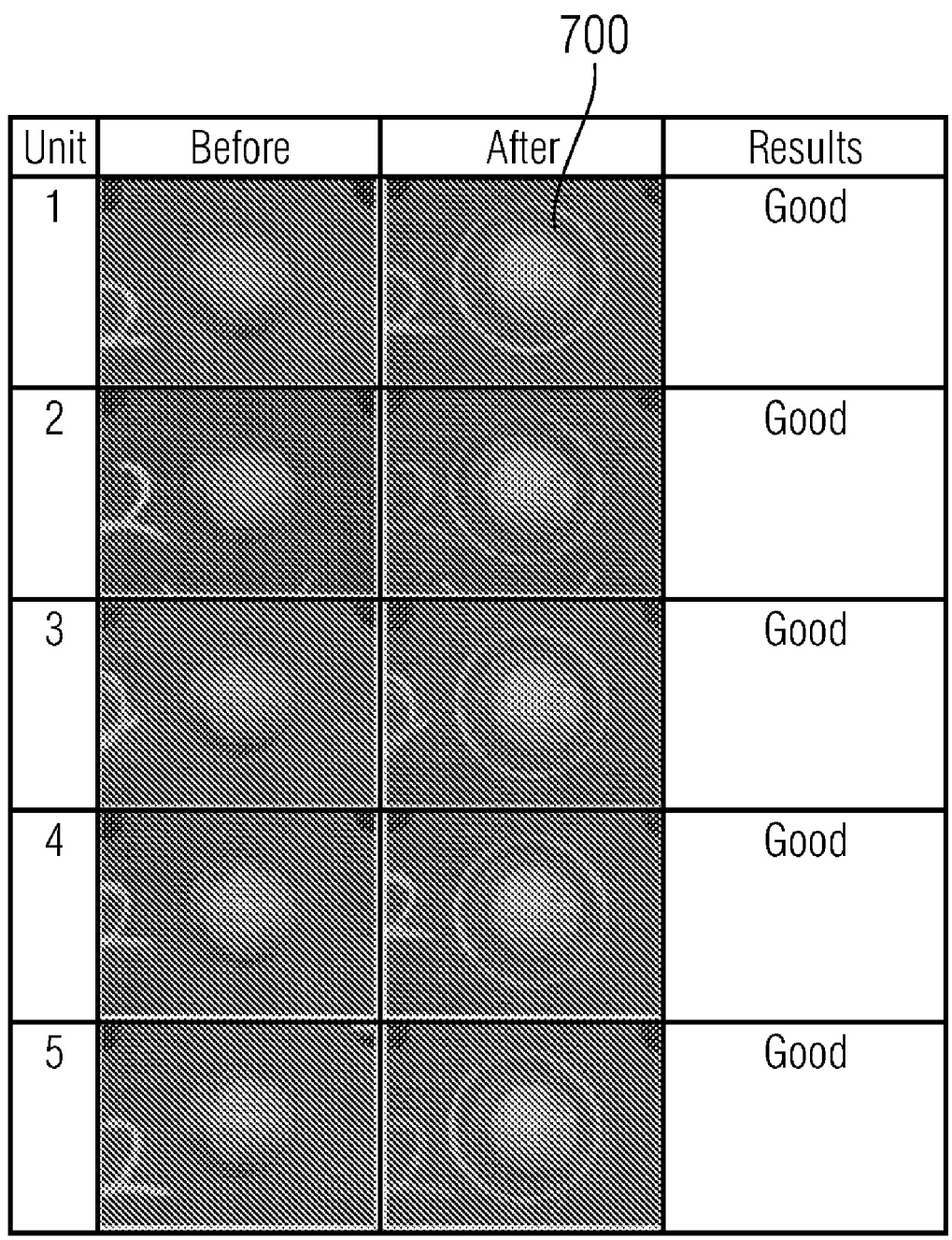
FIG. 7 is a series of photographs that assess mechanical stability after mounting of an exemplary embodiment.

Because the heat sink 104 partially surrounds the screw hole 112, it may provide structural rigidity during mounting. The portion 236 partially surrounding the screw hole 112 may maintain, or at least not significantly degrade, the mechanical stability depending on the application. FIG. 7 shows no visible cracking or resin chip off near the screw hole 700, for test samples according to the exemplary embodiment mounted at about 60 Ncm torque.

Figure 8:
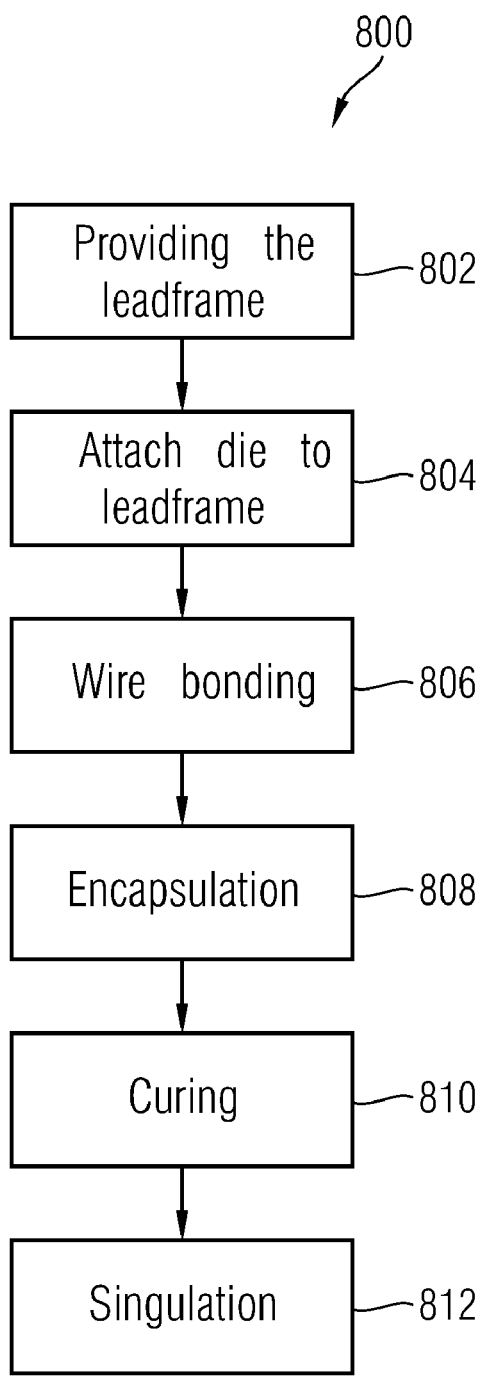
FIG. 8 is a flow diagram of a method of manufacturing according to an exemplary embodiment.

A method 800 of manufacturing a semiconductor package according to an exemplary embodiment is shown in FIG. 8. At 802 a leadframe is provided, including a thin and short heat sink 104. At 804 a die 102 is attached to the heat sink 104. At 806 the leads 106 are wire bonded to contacts on the die 102. At 808 the die 102 and leadframe are encapsulated by resin 110 in a mold. At 810 the resin 110 is cured. At 812 the leadframe is singulated.

Providing the leadframe 802 may be implemented by a large number of copper leadframes attached together in a strip. Each leadframe is connected to the next which allows mass production of a large number of semiconductors.

Attaching the die 804 may be implemented by gluing or soldering the die 102 to the heat sink 104.

Wire bonding 806 may be implemented by soldering wires from each of the leads 106 to surface contacts on the die 102.

Encapsulation 808 may be implemented by placing the leadframe with the attached and bonded die 102 into a mold cavity. The mold may include pins or clamps to hold the heat sink 104 in place to ensure there are no mold flashes. The heat sink clamps may result in two recesses on the front face 120 of the resin near the top of the heat sink 104.

Curing 810 may be implemented by subjecting the resin 110 to a raised temperature for a period of time. For example, the package 100 may be baked at 175° C. for 2 hours depending on the mold compound.

Singulation 812 may be implemented by cutting the leads 106 at the appropriate place to form a separate device.

Figure 9:
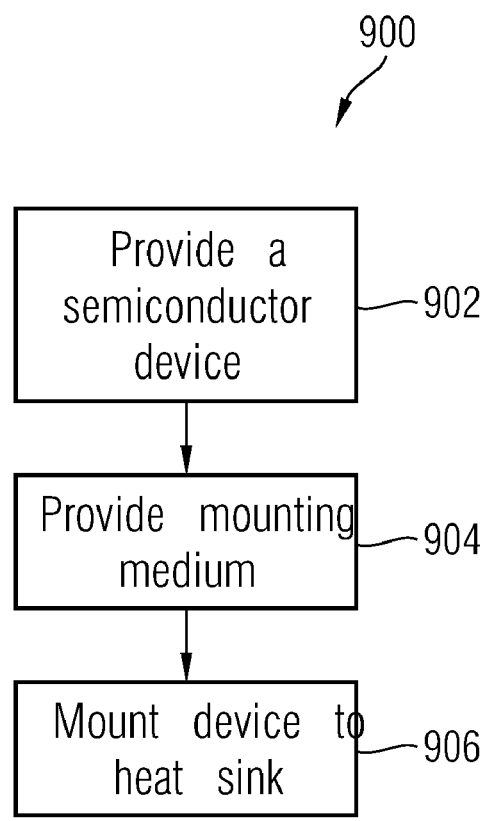
FIG. 9 is a flow diagram of a method of mounting according to an exemplary embodiment.

A TO package according to the exemplary embodiment may be mounted according the method 900 in FIG. 9. At 902 a semiconductor device 100 is provided including a short and thin heat sink 104 and a mounting aperture 112. At 904 a mounting medium, such as heat conducting paste or silica foil, is provided between an external heat sink and the device 100. At 906 the device 100 is mounted to the external heat sink. For example, a TO247 package according to the exemplary embodiment may be mounted a torque of between about 35 Ncm to about 70 Ncm, for example about 60 Ncm, with a maximum gap of about 30 µm.

Whilst exemplary embodiments of the invention have been described in detail, many variations are possible within the scope of the invention as will be clear to a skilled reader. For example, while a TO247 package has been described and illustrated other packages may be applicable depending on the application, such as TO (Transistor outline) packages with THD (Through Hole Device) mounting type. In a further embodiment the package may include a diode die, or a multi-die assembly incorporating a combination of semiconductor dies. In the further embodiment the package may be configured generally as described above, although variations may be appropriate depending on the application.

What is claimed is:

1. A semiconductor device comprising:
    a heat sink;
    a die on the heat sink;
    resin encapsulating the die; and
    a mounting aperture in the resin having at least a segment between the heat sink and a first end of the resin,
    wherein a thickness of the heat sink is no greater than 35% of a thickness of the device.

2. The device in claim 1, wherein the die comprises a transistor and the semiconductor device is a transistor outline semiconductor device.

3. The device in claim 1, wherein the thickness of the heat sink is no greater than 20% of the thickness of the device.

4. The device in claim 1, wherein the thickness of the heat sink is no greater than 10% of the thickness of the device.

5. The device in claim 1, wherein the resin further comprises a second end longitudinally opposed to the first end, the die being closer to the second end than the first end and the mounting aperture has a major segment between the heat sink and the first end.

6. The device in claim 5, wherein the entire mounting aperture is between the heat sink and the first end.

7. The device in claim 1, wherein the device is a TO247 transistor outline package.

8. The device in claim 7, wherein the heat sink is less than 1.8 mm thick.

9. The device in claim 8, wherein the heat sink is less than 1 mm thick.

10. The device in claim 9, wherein the heat sink is 0.5 mm thick.

11. The device in claim 7, wherein the heat sink is spaced from the first end by a distance greater than 3.7 mm.

12. The device in claim 1, wherein the heat sink includes a portion partially surrounding the mounting aperture.

13. The device in claim 1, wherein the heat sink includes a portion surrounding the die.

14. The device in claim 1, wherein warpage of the device is less than 30 µm.

15. The device in claim 1, wherein the device is configured to be mounted to an external heat sink at a force of between 35 Ncm to 70 Ncm.

16. The device in claim 1, wherein there is a single mounting aperture.

17. The device in claim 1, wherein the mounting aperture lies on a central longitudinal axis of the resin.

18. The device in claim 1, wherein the heat sink has a major surface than has an area that is no greater than 150% of an area of a major surface of the die.

19. The device in claim 1, further comprising at least one further die within the resin.

20. The device in claim 1, wherein the die comprises a diode.

21. A semiconductor device comprising:
a die on a heat sink;
resin encapsulating the die; and
an aperture in the resin having a center, wherein a first end of the resin is on one side of the center of the aperture, wherein a second end of the resin is on the opposite side of the center of the aperture and wherein the heat sink is arranged only between the center of the aperture and the second end of the resin.

22. The device in claim 21, wherein a thickness of the heat sink is no greater than 35% of a thickness of the device.

23. The device in claim 21, wherein the die is closer to the second end of the resin than the first end of the resin.

24. The device in claim 21, wherein the heat sink includes a portion partially surrounding the aperture.

25. The device in claim 21, wherein the aperture lies on a central vertical axis of the resin.

26. A semiconductor device comprising:
a die on a heat sink;
resin encapsulating the die, the resin having a top surface and a bottom surface; and
an opening vertically extending from the top surface to the bottom surface of the resin and having a center, the center separating the resin in a first area and a second area, wherein the heat sink is arranged only in the first area but not in the second area.

27. The device in claim 26, wherein a thickness of the heat sink is no greater than 35% of a thickness of the device.

28. The device in claim 26, wherein the first area is greater than the second area.

29. The device in claim 26, wherein the heat sink includes a portion partially surrounding a perimeter of the opening.

* * * * *

UNITED STATES PATENT AND TRADEMARK OFFICE
CERTIFICATE OF CORRECTION

| | | |
|---|---|---|
| PATENT NO. | : 7,821,141 B2 | |
| APPLICATION NO. | : 12/035972 | |
| DATED | : October 26, 2010 | |
| INVENTOR(S) | : Yong et al. | |

It is certified that error appears in the above-identified patent and that said Letters Patent is hereby corrected as shown below:

In Col. 5, line 23, claim 18, after surface delete "than" and insert --that--.

Signed and Sealed this
Eighth Day of March, 2011

David J. Kappos
*Director of the United States Patent and Trademark Office*